(12) United States Patent
Kryvaltsevich

(10) Patent No.: US 11,099,773 B1
(45) Date of Patent: Aug. 24, 2021

(54) MEMORY SYSTEM FOR WRITE OPERATION AND METHOD THEREOF

(71) Applicant: SK hynix Inc., Gyeonggi-do (KR)

(72) Inventor: Siarhei Kryvaltsevich, San Jose, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/779,163

(22) Filed: Jan. 31, 2020

(51) Int. Cl.
 *G06F 3/06* (2006.01)
 *G11C 16/10* (2006.01)
 *G11C 16/32* (2006.01)

(52) U.S. Cl.
 CPC .......... *G06F 3/0656* (2013.01); *G06F 3/0679* (2013.01); *G11C 16/10* (2013.01); *G11C 16/32* (2013.01)

(58) Field of Classification Search
 None
 See application file for complete search history.

(56) References Cited

U.S. PATENT DOCUMENTS

| 2012/0066439 A1* | 3/2012 | Fillingim | G06F 11/3433 |
| | | | 711/103 |
| 2019/0079695 A1 | 3/2019 | Ekbote et al. | |
| 2019/0187928 A1 | 6/2019 | Agarwal | |

* cited by examiner

*Primary Examiner* — James G Norman
(74) *Attorney, Agent, or Firm* — IP & T Group LLP

(57) ABSTRACT

A memory system includes a memory device and a controller. The controller receives data from a host, allocates buffers after a throttling delay, buffers the data in the buffers, provides the buffered data to the memory device for a write operation, generates a response associated with the write operation, and transmits the response to the host. The controller inserts a throttling delay before allocating the buffers and/or transmitting the response. The throttling delay is determined based on a time elapsed since providing previously buffered data to the memory device and the size of the buffered data. The throttling delay is corrected based on the difference of the number of currently allocated buffers and a buffer reserve threshold.

12 Claims, 14 Drawing Sheets

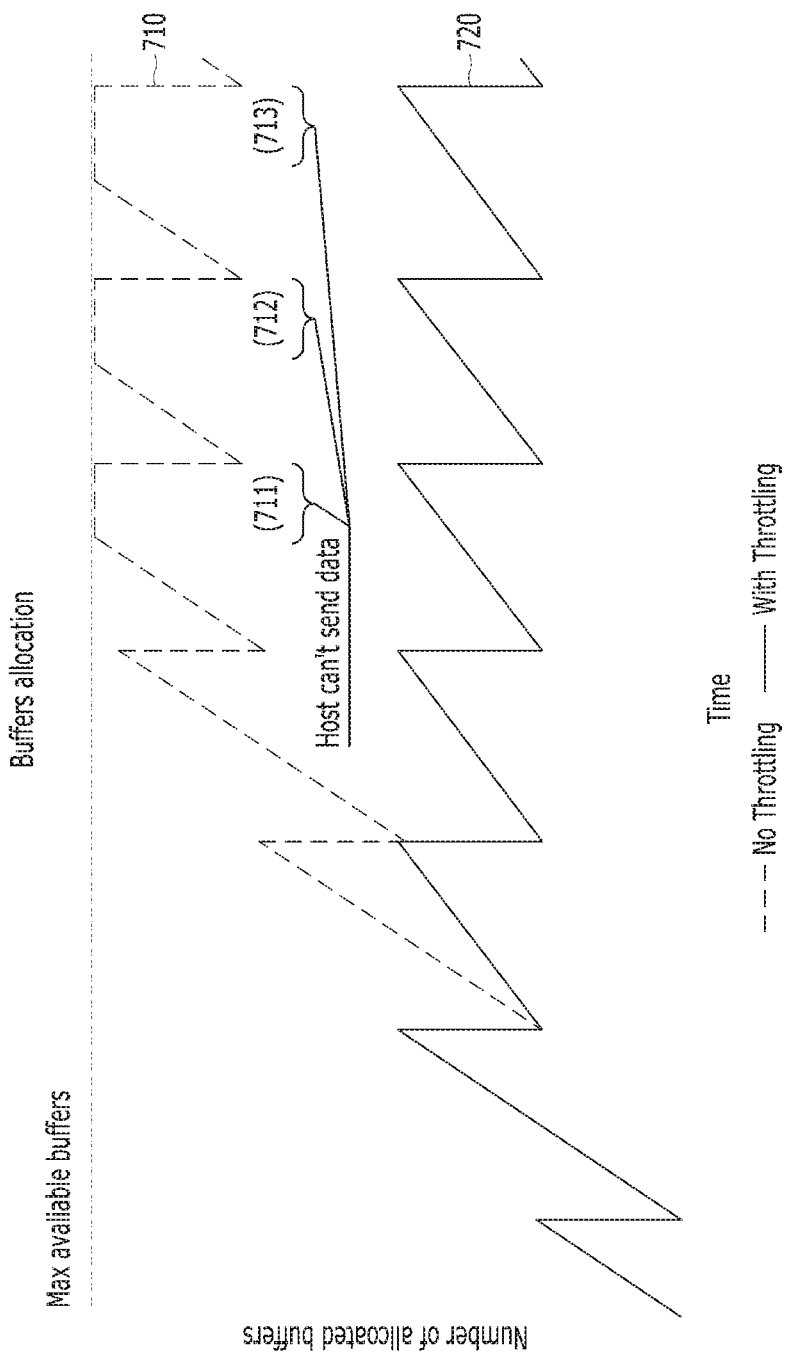

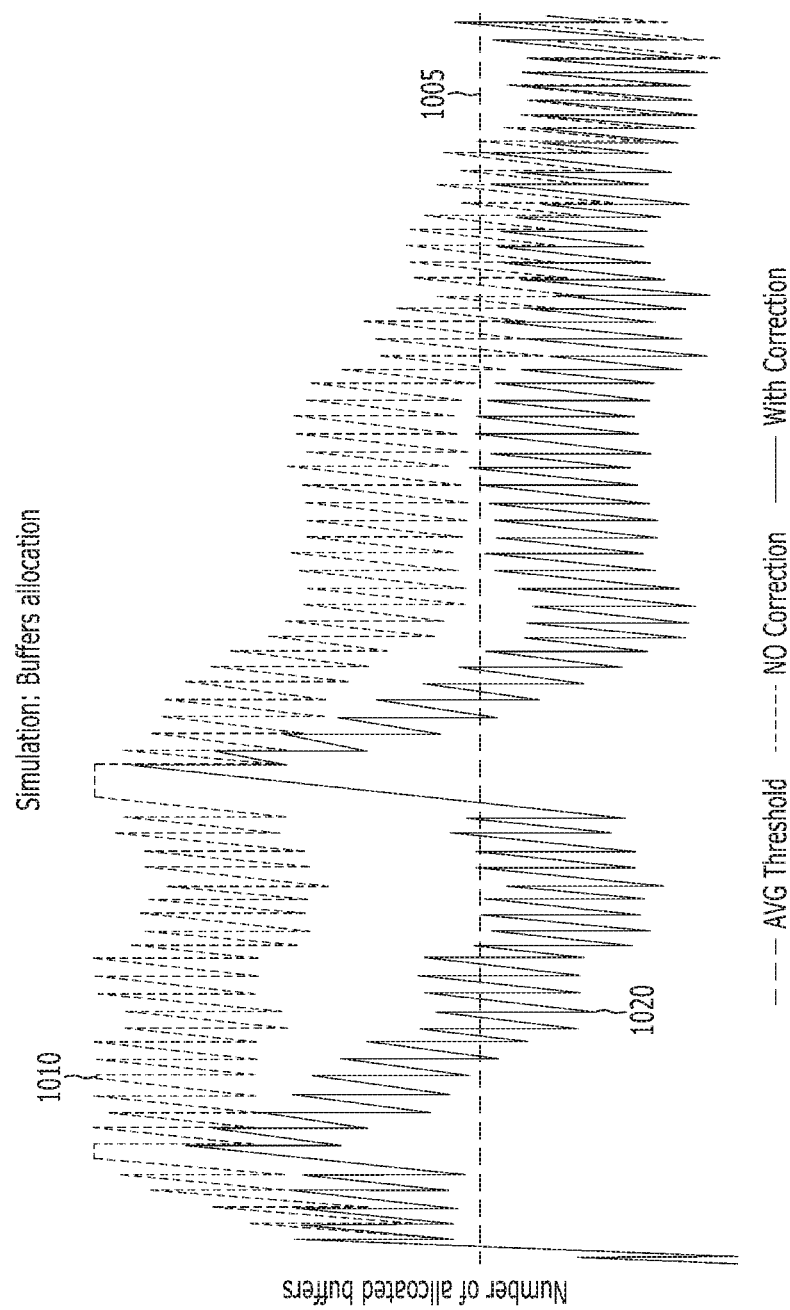

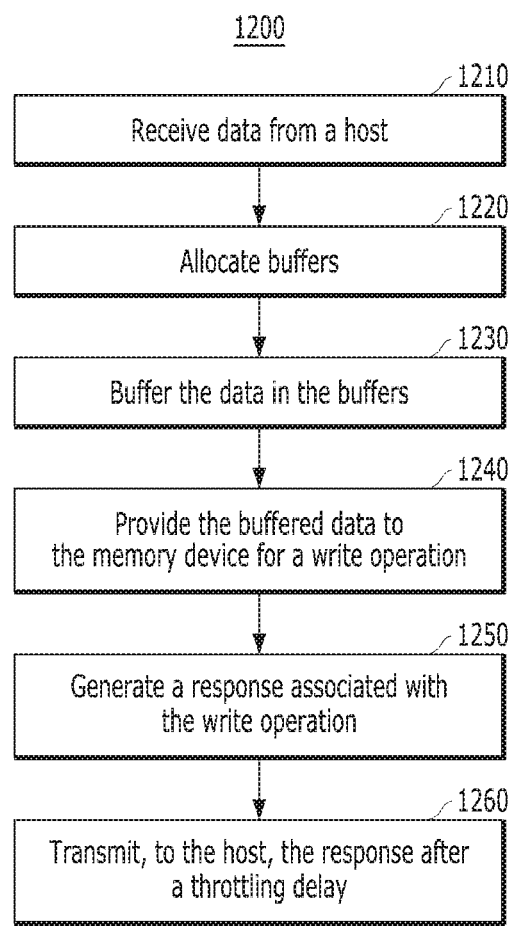

MEMORY SYSTEM FOR WRITE OPERATION AND METHOD THEREOF

BACKGROUND

1. Field

Embodiments of the present disclosure relate to a scheme for performing a write operation in a memory system.

2. Description of the Related Art

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Memory systems using memory devices provide excellent stability, durability, high information access speed, and low power consumption, since they have no moving parts. Examples of memory systems having such advantages include universal serial bus (USB) memory devices, memory cards having various interfaces such as a universal flash storage (UFS), and solid state drives (SSDs). Memory systems may receive a write command from a host and perform a write operation on data associated with the write command.

SUMMARY

Aspects of the present invention include a memory system and a method for receiving a write command from a host and performing a write operation on data associated with the write command.

In one aspect, a memory system includes a memory device and a controller. The controller receives data from a host, allocates buffers, stores the data in the buffers, provides the buffered data to the memory device for a write operation, generates a response associated with the write operation, and transmits the response to the host. The controller may perform one of the allocating and the transmitting after a throttling delay. The throttling delay is determined based on a time elapsed since providing previously buffered data to the memory device and the size of the buffered data.

In another aspect, a method for operating a memory system includes receiving data from a host; allocating buffers after a throttling delay; storing the data in the buffers; providing the buffered data to a memory device for a write operation; generating a response associated with the write operation; and transmitting the response to the host. The throttling delay is determined based on a time elapsed since providing previously buffered data to the memory device and the size of the buffered data.

In still another aspect, a method for operating a memory system includes receiving data from a host; allocating buffers; storing the data in the buffers; providing the buffered data to a memory device for a write operation; generating a response associated with the write operation; and transmitting, to the host, the response after a throttling delay. The throttling delay is determined based on a time elapsed since providing previously buffered data to the memory device and the size of the buffered data.

Additional aspects of the present invention will become apparent from the following description.

BRIEF DESCRIPTION OF THE DRAWINGS

FIG. 7A is a graph illustrating examples of buffer allocation.

FIG. 10A is a diagram illustrating an operation of buffer allocation in accordance with an embodiment of the present invention.

FIG. 12 is a flowchart illustrating an operation of a memory system in accordance with an embodiment of the present invention.

DETAILED DESCRIPTION

Figure 1:
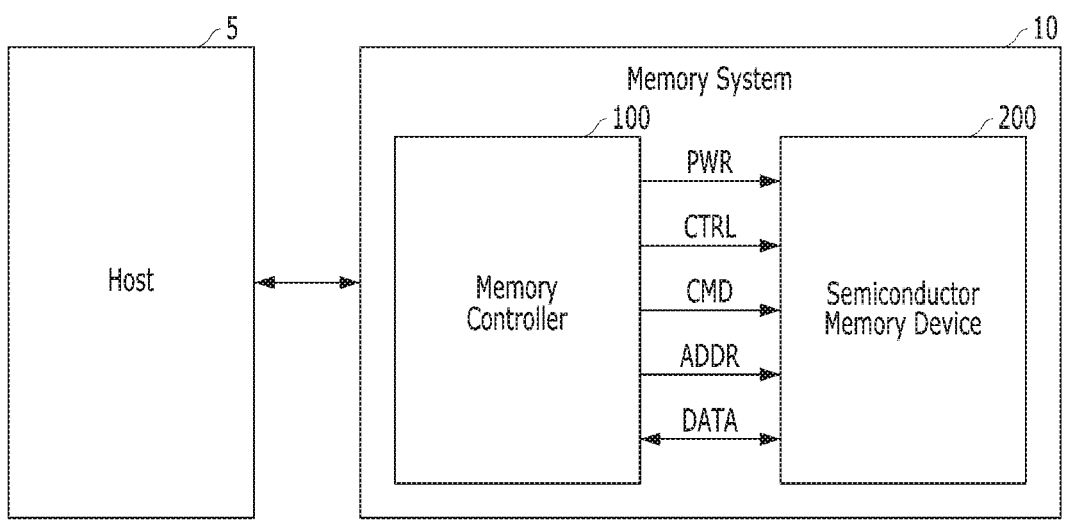
FIG. 1 is a block diagram illustrating a data processing system in accordance with an embodiment of the present invention.

Various embodiments are described below in more detail with reference to the accompanying drawings. The present invention may, however, be embodied in different forms and thus should not be construed as limited to the embodiments set forth herein. Rather, these embodiments are provided so that this disclosure is thorough and complete and fully conveys the scope of the present invention to those skilled in the art. Moreover, reference herein to "an embodiment," "another embodiment," or the like is not necessarily to only one embodiment, and different references to any such phrase are not necessarily to the same embodiment(s). Throughout the disclosure, like reference numerals refer to like parts in the figures and embodiments of the present invention.

The invention can be implemented in numerous ways, including as a process; an apparatus; a system; a computer program product embodied on a computer-readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

A detailed description of embodiments of the invention is provided below along with accompanying figures that illustrate aspects of the invention. The invention is described in connection with such embodiments, but the invention is not limited to any embodiment. The scope of the invention is limited only by the claims. The invention encompasses numerous alternatives, modifications and equivalents within the scope of the claims. Numerous specific details are set forth in the following description in order to provide a thorough understanding of the invention. These details are provided for the purpose of example; the invention may be practiced according to the claims without some or all of these specific details. For clarity, technical material that is known in technical fields related to the invention has not been described in detail so that the invention is not unnecessarily obscured.

FIG. 1 is a block diagram illustrating a data processing system 2 in accordance with an embodiment of the present invention.

Referring FIG. 1, the data processing system 2 may include a host device 5 and a memory system 10. The memory system 10 may receive a request from the host device 5 and operate in response to the received request. For example, the memory system 10 may store data to be accessed by the host device 5.

The host device 5 may be implemented with any one of various kinds of electronic devices. In various embodiments, the host device 5 may include an electronic device such as a desktop computer, a workstation, a three-dimensional (3D) television, a smart television, a digital audio recorder, a digital audio player, a digital picture recorder, a digital picture player, and/or a digital video recorder and a digital video player. In various embodiments, the host device 5 may include a portable electronic device such as a mobile phone, a smart phone, an e-book, an MP3 player, a portable multimedia player (PMP), and/or a portable game player.

The memory system 10 may be implemented with any one of various kinds of storage devices such as a solid state drive (SSD) and a memory card. In various embodiments, the memory system 10 may be provided as one of various components in an electronic device such as a computer, an ultra-mobile personal computer (PC) (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

The memory system 10 may include a memory controller 100 and a semiconductor memory device 200. The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal CTRL may include a command latch enable signal, an address latch enable signal, a chip enable signal, a write enable signal, a read enable signal, as well as other operational signals depending on design and configuration of the memory system 10.

The memory controller 100 and the semiconductor memory device 200 may be integrated in a single semiconductor device such as a solid state drive (SSD). The SSD may include a storage device for storing data therein. When the semiconductor memory system 10 is used in an SSD, operation speed of a host device (e.g., host device 5 of FIG. 1) coupled to the memory system 10 may remarkably improve.

The memory controller 100 and the semiconductor memory device 200 may be integrated in a single semiconductor device such as a memory card. For example, the memory controller 100 and the semiconductor memory device 200 may be so integrated to configure a personal computer (PC) card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

Figure 2:
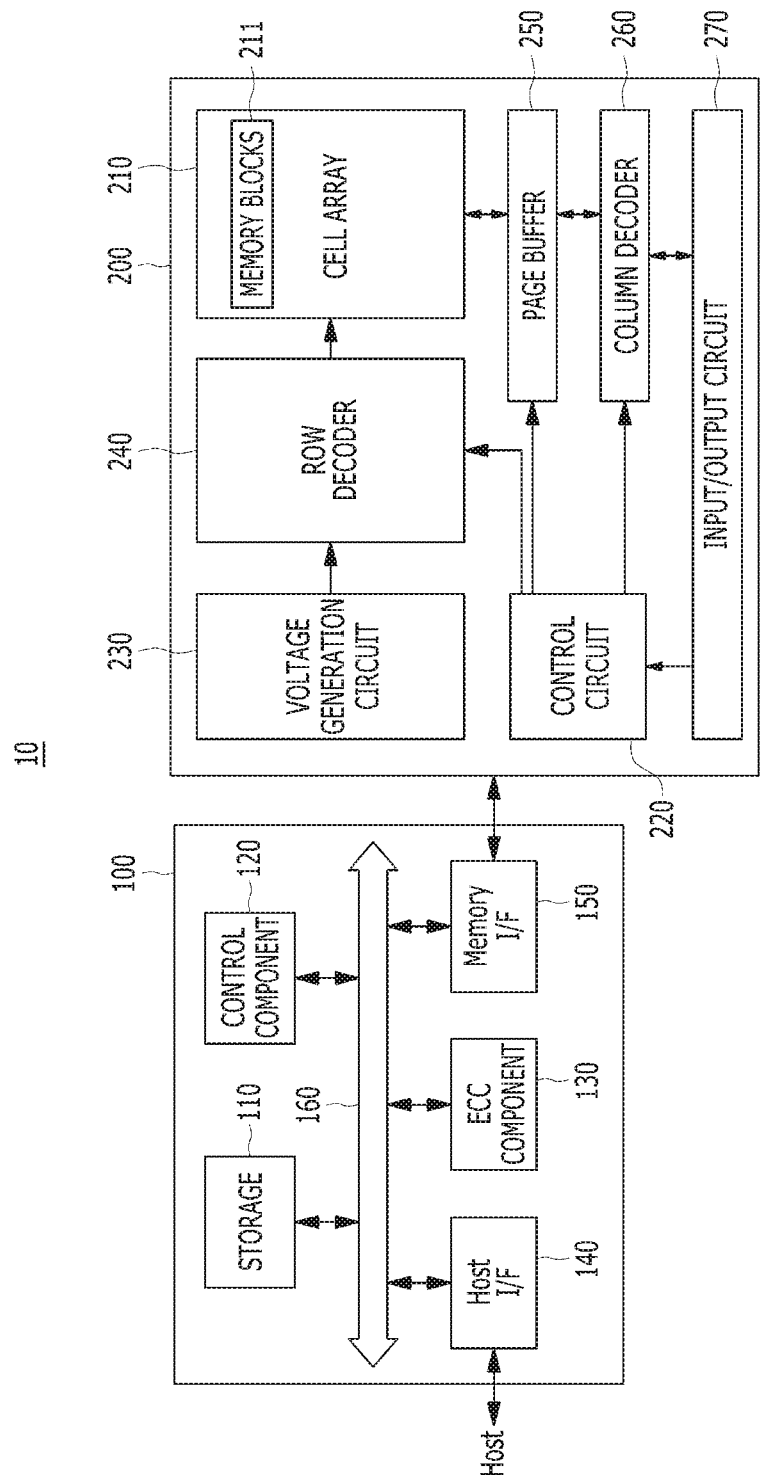
FIG. 2 is a block diagram illustrating a memory system in accordance with an embodiment of the present invention.

FIG. 2 is a block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device (e.g., host device 5 of FIG. 1), and in particular, store data to be accessed by the host device.

The memory device 200 may store data to be accessed by the host device.

The memory device 200 may be implemented with a volatile memory device such as a dynamic random access memory (DRAM) and/or a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120, which may be implemented as a processor such as a central processing unit (CPU), an error correction code (ECC) component 130, a host interface (I/F) 140 and a memory interface (I/F) 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200, in response to a write request or a read request from the host device. The control component 120 may drive firmware, which is referred to as a flash translation layer (FTL), to control general operations of the memory system 10. For example, the FTL may perform operations such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

In various embodiments, the ECC component 130 may perform an error correction operation based on a coded modulation such as a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a Block coded modulation (BCM). However, error correction is not limited to these techniques. As such, the ECC component 130 may include any and all circuits, systems or devices for suitable error correction operation.

The host interface 140 may communicate with the host device through one or more of various interface protocols such as a universal serial bus (USB), a multi-media card (MMC), a peripheral component interconnect express (PCI-e or PCIe), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control component 120. When the memory device 200 is a flash memory such as a NAND flash memory, the memory interface 150 may generate control signals for the memory and process data under the control of the control component 120.

The memory device 200 may include a memory cell array 210, a control circuit 220, a voltage generation circuit 230, a row decoder 240, a page buffer 250, which may be in the form of an array of page buffers, a column decoder 260, and an input and output (input/output) circuit 270. The memory cell array 210 may include a plurality of memory blocks 211 which may store data. The voltage generation circuit 230, the row decoder 240, the page buffer array 250, the column decoder 260 and the input/output circuit 270 may form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address generated by the control circuit 220, and transmit operation voltages supplied from the voltage generation circuit 230 to the selected memory blocks.

Figure 3:
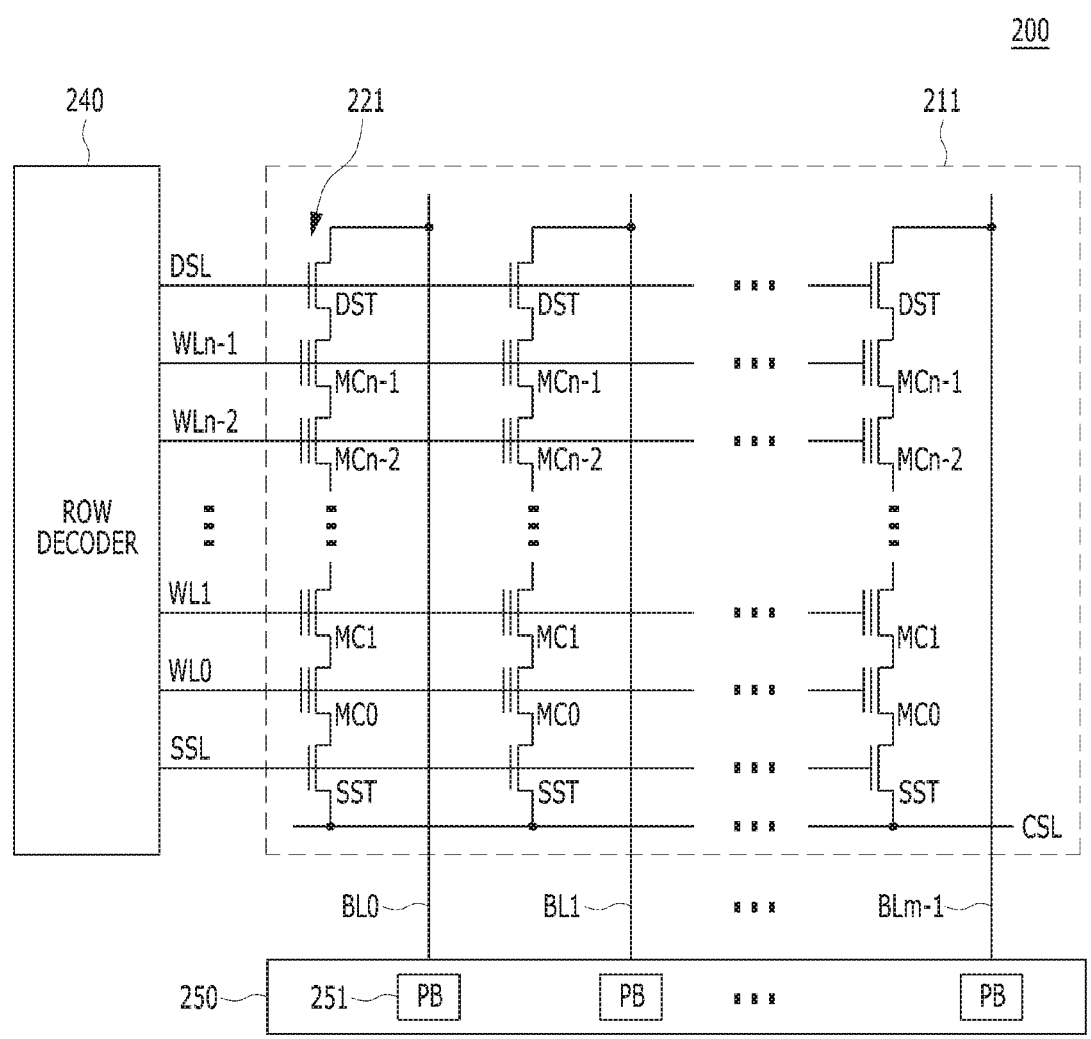
FIG. 3 is a circuit diagram illustrating a memory block of a memory device in accordance with an embodiment of the present invention.

The page buffer 250 may be coupled with the memory cell array 210 through bit lines BL (shown in FIG. 3). The page buffer 250 may precharge the bit lines BL with a positive voltage, transmit data to, and receive data from, a selected memory block in program and read operations, or temporarily store transmitted data, in response to page buffer control signal(s) generated by the control circuit 220.

The column decoder 260 may transmit data to, and receive data from, the page buffer 250 or transmit and receive data to and from the input/output circuit 270.

The input/output circuit 270 may transmit to the control circuit 220 a command and an address, received from an external device (e.g., the memory controller 100 of FIG. 1), transmit data from the external device to the column decoder 260, or output data from the column decoder 260 to the external device, through the input/output circuit 270.

The control circuit 220 may control the peripheral circuit in response to the command and the address.

FIG. 3 is a circuit diagram illustrating a memory block of a semiconductor memory device in accordance with an embodiment of the present invention. For example, the memory block of FIG. 3 may be any of the memory blocks 211 of the memory cell array 210 shown in FIG. 2.

Referring to FIG. 3, the exemplary memory block 211 may include a plurality of word lines WL0 to WLn-1, a drain select line DSL and a source select line SSL coupled to the row decoder 240. These lines may be arranged in parallel, with the plurality of word lines between the DSL and SSL.

The exemplary memory block 211 may further include a plurality of cell strings 221 respectively coupled to bit lines BL0 to BLm-1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn-1 may be serially coupled between the selection transistors DST and SST. Each of the memory cells may be formed as a multiple level cell. For example, each of the memory cells may be formed as a single level cell (SLC) storing 1 bit of data. Each of the memory cells may be formed as a multi-level cell (MLC) storing 2 bits of data. Each of the memory cells may be formed as a triple-level cell (TLC) storing 3 bits of data. Each of the memory cells may be formed as a quadruple-level cell (QLC) storing 4 bits of data.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word line may be referred to as a physical page. Therefore, the number of physical pages in the memory block 211 may correspond to the number of word lines.

The page buffer array 250 may include a plurality of page buffers 251 that are coupled to the bit lines BL0 to BLm−1. The page buffers 251 may operate in response to page buffer control signals. For example, the page buffers 251 may temporarily store data received through the bit lines BL0 to BLm−1 or sense voltages or currents of the bit lines during a read or verify operation.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

In memory systems (or storage systems) such as solid-state drives (SSDs), quality of service (QoS) refers to managing data traffic to reduce loss and latency (i.e., response time), managing performance of input/output (I/O) operations (measured in I/O per second (IOPS) and allocating resources to perform a workload including read and write operations. Thus, QoS is an important indicator that measures the performance of a memory system. In some cases, even if a memory system can provide acceptable average write latency, individual write latencies may be much higher than the average write latency, which is undesirable. Accordingly, it is desirable to provide a scheme to improve QoS associated with write commands by optimizing a transfer and accumulation process for data from a host (i.e., host data).

Figure 4:
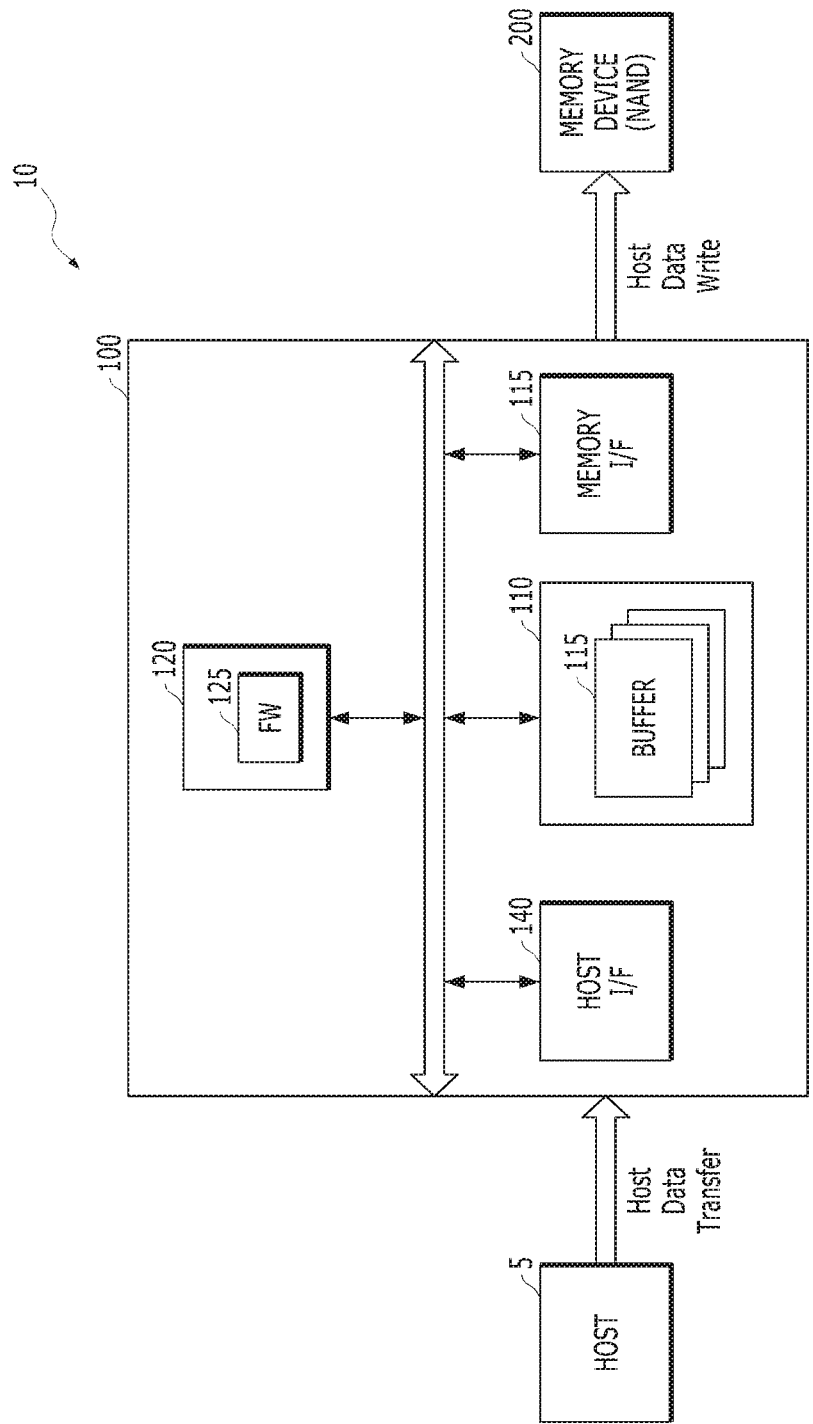
FIG. 4 is a diagram illustrating a data processing system in accordance with an embodiment of the present invention.

FIG. 4 is a diagram illustrating a data processing system in accordance with an embodiment of the present invention.

Referring to FIG. 4, the data processing system may include a host 5, a memory controller 100 and a memory device 200. The memory controller 100 and the memory device 200 may configure a memory system. For example, the memory controller 100 and the memory device 200 may include various components of the memory system 10 as shown in FIG. 2. The memory controller 100 and the memory device 200 may perform read and erase operations as described above. Further, the memory controller 100 and the memory device 200 may perform a write operation as described above and herein.

The memory device 200 may be implemented with NAND flash memory. The memory controller 100 may include a storage 110, a control component 120, a host interface (I/F) 140 and a memory interface (I/F) 150. The control component 120 may include firmware (FW) 125. The storage 110 may include a plurality of buffers 115.

The host 5 may transfer data (e.g., data for a write operation) to the memory controller 100. The host interface 140 may receive the data from the host 5 (i.e., host data). The firmware 125 may manage the storage 110 to buffer the host data in the storage 110. In some embodiments, the storage 110 may be implemented with a random access memory (RAM) and the firmware 125 may manage the storage 110 in fixed size units, for example, a plurality of buffers 115. In some embodiments, size of a buffer is selected to allow operations with the memory device 200. For example, for NAND memory, it may be less than or equal to the size of the NAND page. Buffers are allocated to contain data from the host 5, hence the amount of the host data buffered in given time is the product of the number of host write commands and the size of the buffers during the time. When the amount of the host data in the plurality of buffers 115 reaches a certain level, the firmware 125 may write the buffered host data to the memory device 200 through the memory interface 150. In some embodiments, the firmware 125 may periodically flush the buffered data to the memory device 200 by a certain unit (e.g., a block size). The block size may depend on few factors such as a page size of the memory device 200, a configuration of the memory device 200 and specification for a memory controller.

Figure 5:
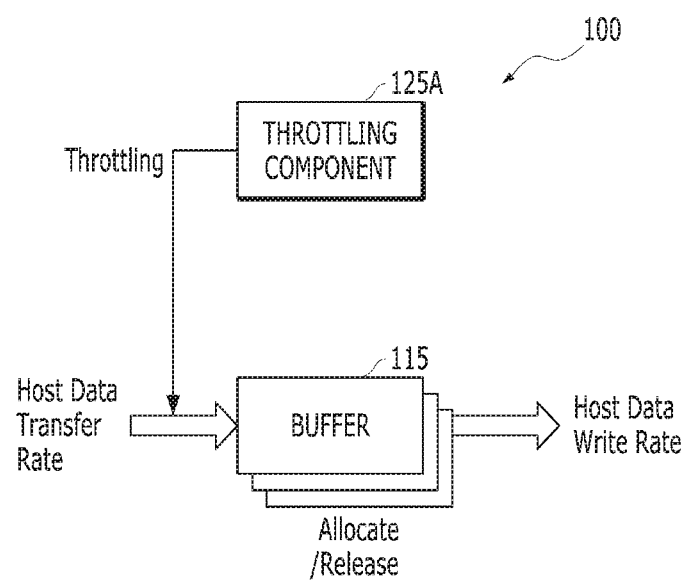
FIG. 5 is a diagram illustrating a memory controller in accordance with an embodiment of the present invention.

FIG. 5 is a diagram illustrating a memory controller 100 in accordance with an embodiment of the present invention.

Referring to FIG. 5, the memory controller 100 may include a plurality of buffers 115 and a throttling component 125A. The throttling component 125A may be a component of the firmware 125. The memory controller 100 (i.e., the control component 120 of FIG. 4) may allocate the plurality of buffers 115 before transfer of host data and the throttling component 125A may add a delay during the allocation. The memory controller 100 may store the host data in the plurality of buffers 115. In other words, the memory controller 100 may fill the plurality of buffers 115 with the host data. Further, the memory controller 100 may flush the buffered host data to the memory device 200. After the buffered host data is flushed to the memory device 200 from the plurality of buffers 115, the memory controller 100 may release that buffer for other use.

Figure 6:
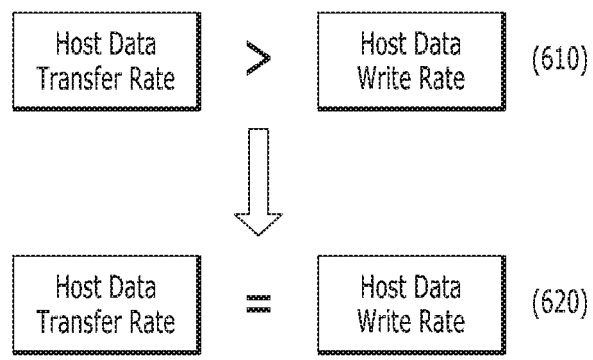
FIG. 6 is a diagram illustrating cases of relationships between a host data transfer rate and a host data write rate in accordance with an embodiment of the present invention.

In FIGS. 4 and 5, ideally, the host data transfer rate (or host data transfer throughput) between the host 5 and the memory controller 100 is the same as the host data write rate (or host data write throughput) between the memory controller 100 and the memory device 200. However, in some cases, the host data transfer rate may be different from the host data write rate, as shown in (610) of FIG. 6. If the host data transfer rate is greater than the host data write rate, the host 5 fills the buffers 115 faster than the memory controller 100 is able to flush and release the buffers 115, in which case the number of allocated buffers reaches a maximum number of available buffers, as shown in (710) of FIG. 7A. In this case, the host 5 has to wait until the memory controller 100 writes host data to the memory device 200, releases the buffers 115 and then it is able to accept new host data from the host 5 (711, 712, 713). This buffer waiting time is part of overall write command latency and thus the write command latency significantly increases as the buffer waiting time increases, as shown in (730) of FIG. 7B.

In order to avoid increases in write command latency, the host 5 should transfer host data at the same rate as the memory controller 100 is able to write the host data to the memory device 200. In various embodiments, the host data transfer rate is throttled to be to the same as the host data write rate, as shown in (620) of FIG. 6. If the host data transfer rate is controlled to be the same as the host data write rate, the number of allocated buffers will remain under the maximum number of available buffers, as shown in (720) of FIG. 7A. Further, although the throttling itself increases average write command latency, such increase is relatively small as shown in (740) of FIG. 7B, and allows to significantly reduce latency spikes that occur during buffer waiting time (711,712,713).

Figure 8:
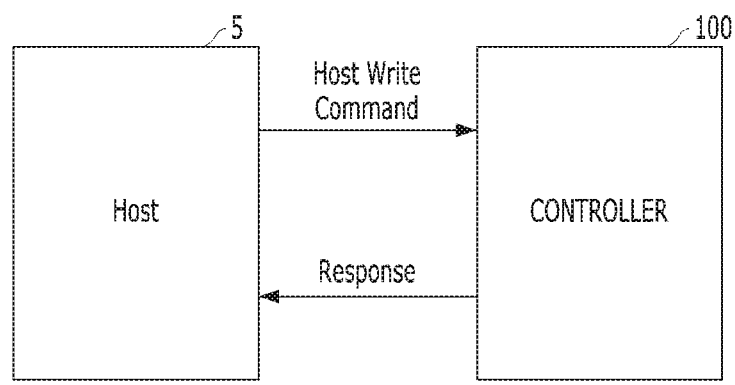
FIG. 8 is a diagram illustrating command latency between issuance of a host write command and receipt of a response in accordance with an embodiment of the present invention.
Figure 8:
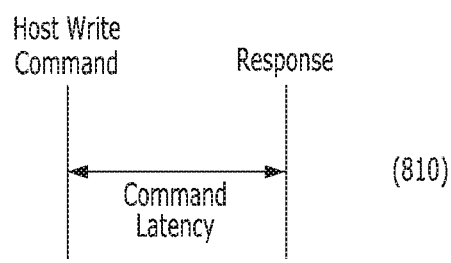
Figure 8:
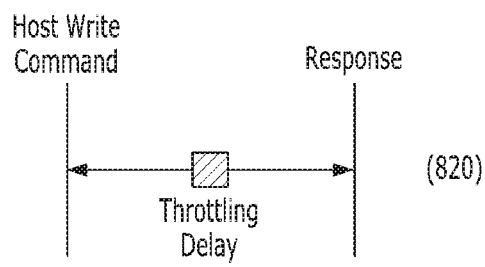

FIG. 8 is a diagram illustrating command latency between issuance of a host write command and receipt of the response in accordance with an embodiment of the present invention.

Figure 7B:
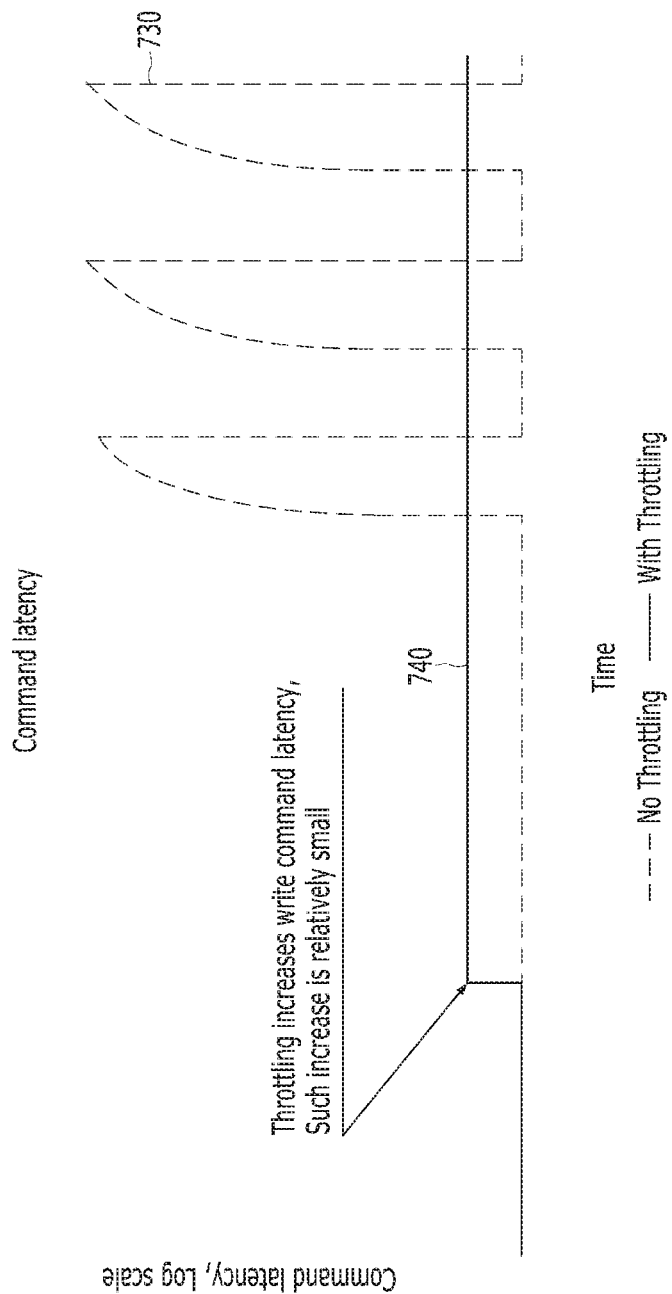
FIG. 7B is a graph illustrating examples of command latency.

Referring to FIG. 8, the host 5 may transfer the host write command with data for a write operation to the controller 100. When the write operation is performed, the controller 100 may transfer to the host 5 a response indicating completion of the write operation for the host write command. As shown in (810), the command latency may be determined by measuring the time from issuance of the host write command by the host 5 to receipt of the response by the host 5. In some cases, the command latency may rise as shown in FIG. 7B. In order to limit the host data transfer rate, the controller 100 with the throttling component 125A may generate and add a throttling delay between receipt of the host write command by the controller 100 and the transmission of the response to the host 5 (820).

In an embodiment, the throttling delay may be added before the controller 100 allocates one or more new buffers for host data. This embodiment is described with FIGS. 9 to 11.

In various embodiments, when the host data is flushed to the memory device 200, the throttling component 125A may collect the following information as shown in List1:

---
List1:
---
$N_{curr}$ : Number of allocated buffers before the flush
$T_{flush}$ : Time from the previous flush
---

In List1, $N_{curr}$ represents the number of allocated buffers before the flush, and $T_{flush}$ represents the time elapsed since the previous flush. Flush may be detected when buffers are released.

Figure 9:
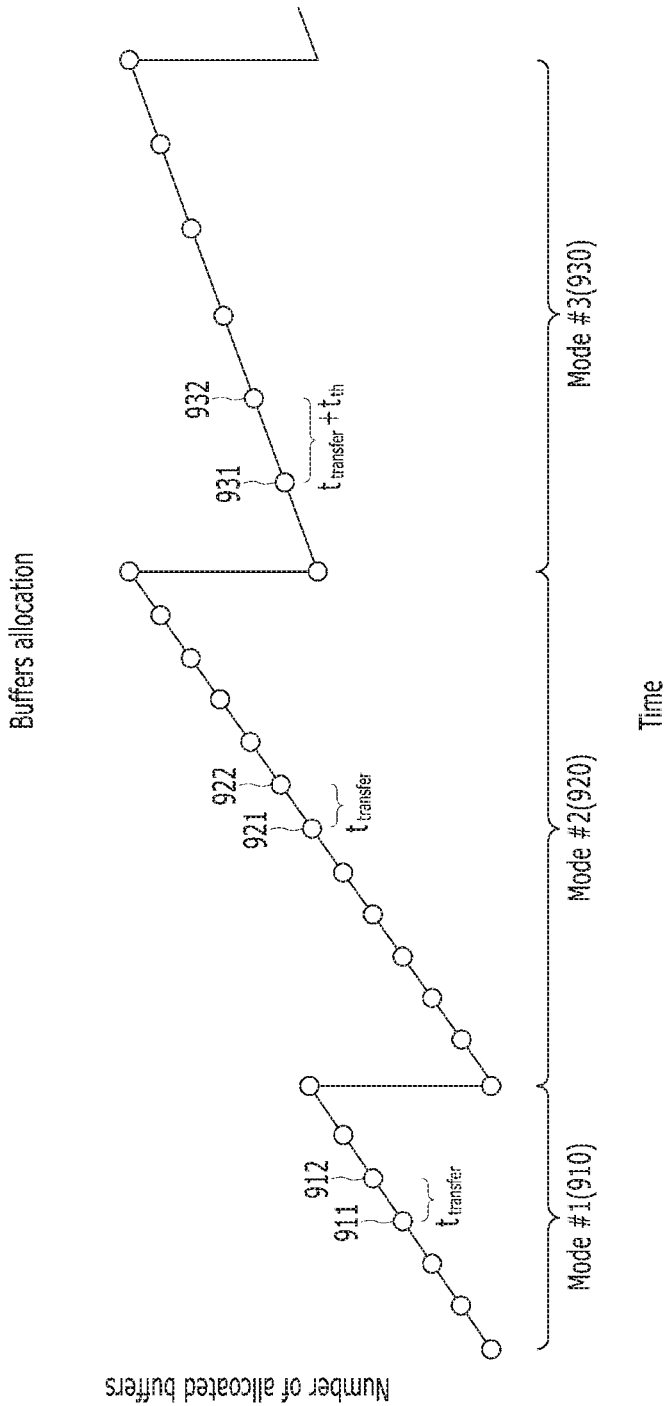
FIG. 9 is a diagram illustrating operation modes in accordance with an embodiment of the present invention.

FIG. 9 is a diagram illustrating operation modes in accordance with an embodiment of the present invention.

Referring to FIG. 9, the operation modes may include a first mode Mode #1 (910), a second mode Mode #2 (920) and a third mode Mode #3 (930). The first mode Mode #1 is a default state when throttling is not applied. The throttling component 125A of the controller 100 may monitor $N_{curr}$ and make decision to switch to Mode #3 preceded by Mode #2 if $N_{curr}$ is too high.

In the first mode Mode #1 (910), no throttling is performed. When workload (i.e., write operation) from the host 5 is not substantial or has just started, the memory controller 100 may flush host data right after enough host data is accumulated in the buffers 115. Hence, the number of allocated buffers does not exceed the size of the flushed block $N_{flush}$. The flushed block represents a fixed amount of data. In this mode, the buffers 115 may be allocated at a time 912 after a transfer time $t_{transfer}$ starting at a time 911. The transfer time $t_{transfer}$ may represent the time it takes to generate and transfer host data from the host 5 to the controller 100.

In the second mode Mode #2 (920), parameters that determine a throttling mode may be monitored. When the host 5 starts to generate a sustained workload, the memory controller 100 may start flushing periodically. Thus, the throttling component 125A may measure a flush period between a previous flush and a current flush. In this mode, the buffers 115 may be allocated at a time 922 after a transfer time $t_{transfer}$ starting at a time 921, i.e. the buffer allocation time is the same as for Mode #1.

In the third mode Mode #3 (930), throttling is performed. The throttling component 125A may measure the flush period and calculate a throttling delay time $t_{th}$. In this case, the buffers 115 may be allocated at a time 932 after a sum of a transfer time $t_{transfer}$ and the throttling delay $t_{th}$ starting at a time 931.

When the host 5 starts to generate a sustained workload, the throttling component 125A may determine an average flush period $T_{flush}^{avg}$ and adjust the throttling delay $t_{th}$.

In some embodiments, the throttling component 125A may calculate the average flush period using equation (1):

$$T_{flush}^{avg}(n) = T_{flush}^{avg}(n-1) + \frac{T_{flush} - T_{flush}^{avg}(n-1)}{n} \quad (1)$$

In equation (1), n represents an averaging window length, $T_{flush}^{avg}(n-1)$ represents the previous average flush period and, $T_{flush}^{avg}(n)$ represents the current average flush period.

As previously mentioned, the host data transfer rate should be the same as the host data write rate (i.e., the host data flushing rate) to achieve best QoS as shown in equation (2):

$$\frac{1}{t_{total}} = \frac{N_{flush}}{T_{flush}^{avg}} \Rightarrow \frac{1}{t_{transfer} + t'_{th}} = \frac{N_{flush}}{T_{flush}^{avg}} \quad (2)$$

In equation (2), $$\frac{1}{t_{total}}$$

represents the host data transfer rate and $$\frac{N_{flush}}{T_{flush}^{avg}}$$

represents the host data flushing rate. $t_{total}$ represents total time between buffer allocations. $t_{total}$ is inversely proportional to the host data transfer rate. $t_{total}$ consists of transfer time $t_{transfer}$ and throttling time $t'_{th}$. The transfer time $t_{transfer}$ is a time between consecutive buffer allocations when the memory system operates without throttling, which corresponds to the generation and transfer of host data from the host 5 to the controller 100. $N_{flush}$ represents the size of a block of data in buffers which is flushed to the memory device 200.

From equation (2), throttling delay $t'_{th}$ may be calculated from equation (3):

$$t'_{th} = \frac{T_{flush}^{avg}}{N_{flush}} - t_{transfer} \quad (3)$$

In some embodiments, flush period $T_{flush}$ is not a constant value; rather, it may vary within a relatively wide range. In the "No Correction" scenario, shown in FIG. 10A, when $T_{flush}$ significantly exceeds average flush period $T_{flush}^{avg}$ (1005), the throttling component 125A cannot release buffers 115 for relatively long time. Thus, it is possible that all buffers may be allocated (1010) and write command latency may rise, as indicated in the "No Correction" scenario shown in (1030) of FIG. 10B. In order to minimize the probability of this scenario, in some embodiments, a buffer reserve threshold $N_{treshold}$ may be introduced.

The throttling component 125A tries to keep the number of currently allocated buffers $N_{curr}$ below $N_{treshold}$ by adding a correction delay $t_{corr}$ to $t'_{th}$. Correction delay $t_{corr}$ is proportional to $\{N_{curr} - N_{treshold}\}$ as indicated in equation (4):

$$t_{corr} \propto N_{curr} - N_{treshold} \quad (4)$$

The more buffers that are allocated, the bigger $t_{corr}$ becomes and the more difficult it is for the host 5 to fill all buffers available in the memory system. If the number of currently allocated buffers $N_{curr}$ is less than $N_{treshold}$, the correction delay $t_{corr}$ may be reduced, e.g., have a value of $-t'_{th}$ because at this moment the memory system does not need any throttling.

In view of the above considerations, total throttling delay $t_{th}$ is determined as indicated in equation (5):

$$t_{th} = t'_{th} + t_{corr} = \frac{T_{flush}^{avg}}{N_{flush}} - t_{transfer} + t_{corr} \quad (5)$$

Figure 10B:
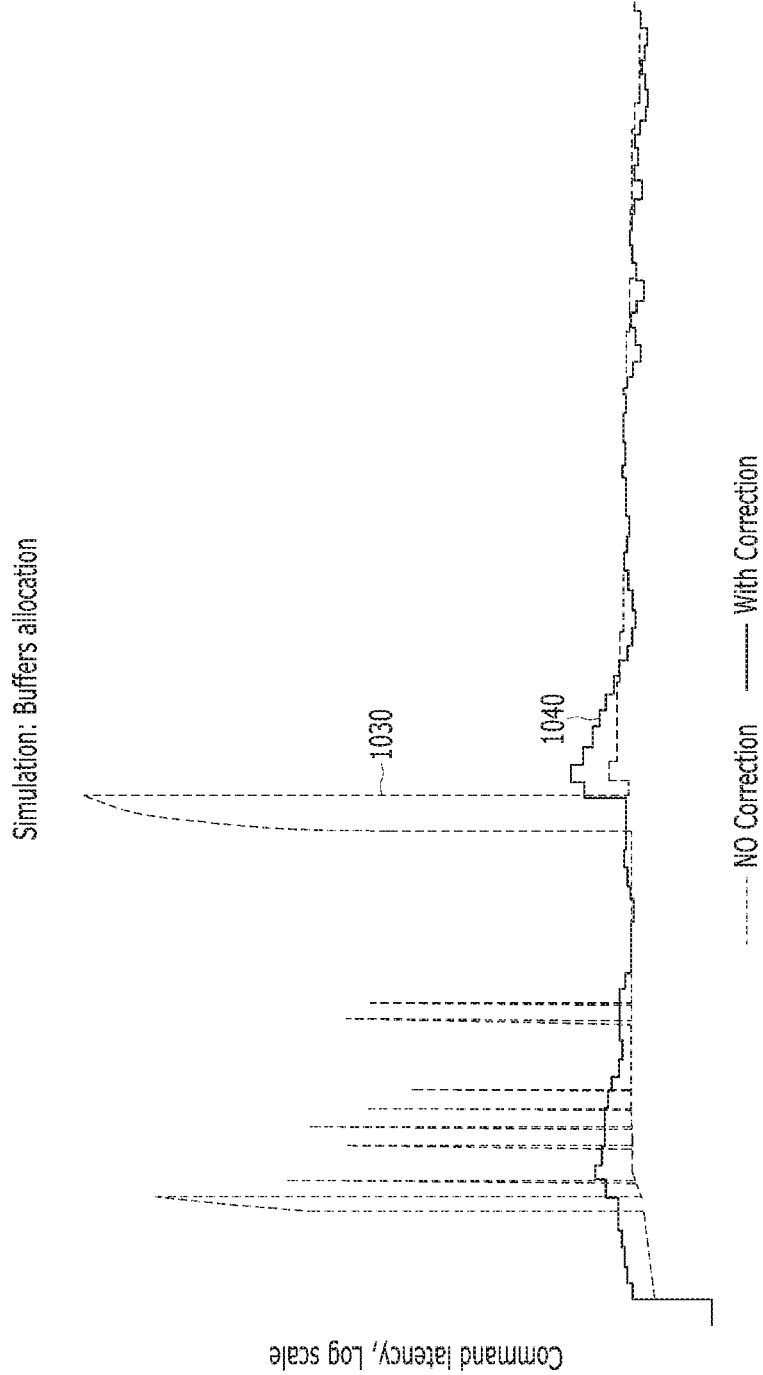
FIG. 10B is a diagram illustrating command latency in accordance with an embodiment of the present invention.

In FIGS. 10A and 10B, "With Correction" (1020) and (1040) show system behavior when optimal correction is applied to the memory system, i.e., the total throttling delay $t_{th}$ is applied to the memory system.

Figure 11:
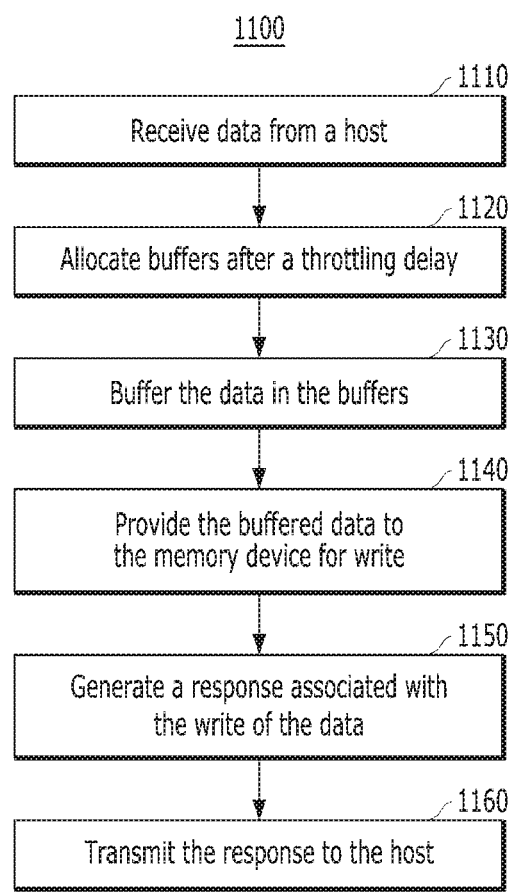
FIG. 11 is a flowchart illustrating an operation of a memory system in accordance with an embodiment of the present invention.

FIG. 11 is a flowchart illustrating an operation 1100 of a memory system in accordance with an embodiment of the present invention. The operation 1100 may be performed by the control component 120 in FIGS. 4 and 5, which corresponds to embodiments in FIGS. 8 to 10B.

Referring to FIG. 11, the operation 1100 may include steps 1110 to 1160. At step 1110, the control component 120 may receive data from the host 5. At step 1120, the control component 120 may allocate buffers 115 after a throttling delay.

In some embodiments, the throttling delay is determined based on a time elapsed since providing previously buffered data to the memory device 200 and the size of the buffered data.

In some embodiments, the throttling delay is determined based on average flush period, the size of a block of data and a transfer time of the data from the host 5 (see equations (1) to (3)).

In some embodiments, the throttling delay is corrected based on the difference of the number of currently allocated buffers and a buffer reserve threshold (see equations (4) and (5)).

At step 1130, the control component 120 may buffer (or store) the data in the buffers 115. At step 1140, the control component 120 may provide the buffered data for write to the memory device 200. In some embodiments, the control component 120 flushes block unit of the buffered data to the memory device 200, where the block unit represents a fixed amount of data.

At step 1150, the control component 120 may generate a response associated with the write of the data. At step 1160, the control component 120 may transmit the response to the host 5.

In another embodiment, the throttling delay may be added before the response (i.e., write command status) is transmitted to the host 5. The throttling delay (i.e., status throttling delay) $t_{th\_status}$ may be calculated as the sum of all buffer allocation delays for write command as shown in equation (6):

$$t_{th\_status} = \left(\frac{T_{flush}^{avg}}{N_{flush}} - t_{transfer} + t_{corr}\right) N_{cmd} \quad (6)$$

In equation (6), $N_{cmd}$ represents the number of buffers in the write command.

In this embodiment, the host data transfer may be completed in less time and the host interface may be utilized more efficiently.

FIG. 12 is a flowchart illustrating an operation 1200 of a memory system in accordance with an embodiment of the present invention. The operation 1200 may be performed by the control component 120 in FIGS. 4 and 5.

Referring to FIG. 12, the operation 1200 may include steps 1210 to 1260. At step 1210, the control component 120 may receive data from the host 5. At step 1220, the control component 120 may allocate buffers 115.

At step 1230, the control component 120 may buffer the data in the buffers 115. At step 1240, the control component 120 may provide the buffered data to the memory device 200 for a write operation. In some embodiments, the control component 120 flushes a block unit of the buffered data to the memory device 200.

At step 1250, the control component 120 may generate a response associated with the write of the data. At step 1260, the control component 120 may transmit the response after a throttling delay to the host 5.

In some embodiments, the throttling delay is determined based on a time elapsed from providing previously buffered data to the memory device 200 and the size of the buffered data.

In some embodiments, the throttling delay is determined based on average flush period, the size of a block unit and a transfer time of the data from the host 5 (see equations (1) to (3) and (6)).

In some embodiments, the throttling delay is corrected based on the difference of the number of currently allocated buffers and a buffer reserve threshold (see equations (4) to (6)).

As described above, the controller in accordance with embodiments may control throughput of host data transfer using throttling delay. Accordingly, QoS of write commands may be improved.

Although the foregoing embodiments have been illustrated and described in some detail for purposes of clarity and understanding, the present invention is not limited to the details provided. There are many alternative ways of implementing the invention, as one skilled in the art will appre-

What is claimed is:

1. A memory system comprising:
a memory device; and
a controller suitable for:
receiving data from a host;
allocating buffers;
buffering the data in the buffers;
providing the buffered data to the memory device for a write operation;
generating a response associated with the write operation; and
transmitting the response to the host,
wherein the controller performs one of the allocating and the transmitting after a throttling delay, and
wherein the throttling delay is determined based on a time elapsed since providing previously buffered data to the memory device and the size of the buffered data.

2. The memory system of claim 1, wherein the controller flushes, to the memory device, a fixed amount of the buffered data per flush.

3. The memory system of claim 2, wherein the throttling delay is determined based on average flush period, the fixed amount of flushed data and a transfer time of the data from the host.

4. The memory system of claim 3, wherein the throttling delay is corrected such that the number of currently allocated buffers is kept within a particular range.

5. A method for operating a memory system comprising:
receiving data from a host;
allocating buffers after a throttling delay;
buffering the data in the buffers;
providing the buffered data to a memory device for a write operation;
generating a response associated with the write operation; and
transmitting the response to the host,
wherein the throttling delay is determined based on a time elapsed since providing previously buffered data to the memory device and the size of the buffered data.

6. The method of claim 5, wherein the providing of the buffered data includes flushing, to the memory device, a fixed amount of the buffered data per flush.

7. The method of claim 6, wherein the throttling delay is determined based on average flush period, the fixed amount of flushed data and a transfer time of the data from the host.

8. The method of claim 7, wherein the throttling delay is corrected such that the number of currently allocated buffers is kept within a particular range.

9. A method for operating a memory system comprising:
receiving data from a host;
allocating buffers;
buffering the data in the buffers;
providing the buffered data to a memory device for a write operation;
generating a response associated with the write operation; and
transmitting, to the host, the response after a throttling delay,
wherein the throttling delay is determined based on a time elapsed since providing previously buffered data to the memory device and the size of the buffered data.

10. The method of claim 9, wherein the providing of the buffered data includes flushing, to the memory device, a fixed amount of the buffered data per flush.

11. The method of claim 10, wherein the throttling delay is determined based on average flush period, the fixed amount of data and a transfer time of the data from the host.

12. The method of claim 11, wherein the throttling delay is corrected such that the number of currently allocated buffers is kept within a particular range.

* * * * *